United States Patent [19]

Glang et al.

[11] 4,048,350

[45] Sept. 13, 1977

[54] SEMICONDUCTOR DEVICE HAVING REDUCED SURFACE LEAKAGE AND METHODS OF MANUFACTURE

[75] Inventors: Reinhard Glang, Reston, Va.; Stanley Irwin Raider, Poughkeepsie, N.Y.

[73] Assignee: International Business Machines Corporation, Armonk, N.Y.

[21] Appl. No.: 615,040

[22] Filed: Sept. 19, 1975

[51] Int. Cl.² .................. H01L 21/283; H01L 21/461
[52] U.S. Cl. ..................................... 427/93; 148/1.5; 148/187; 148/188; 357/23; 357/52; 427/85; 427/95
[58] Field of Search .................. 148/1.5, 188; 427/85, 427/93, 95; 357/23, 52

[56] References Cited

U.S. PATENT DOCUMENTS

| | | | |
|---|---|---|---|
| 3,084,079 | 4/1963 | Harrington | 148/188 |
| 3,183,130 | 5/1965 | Reynolds et al. | 148/188 |
| 3,328,210 | 6/1967 | McCaldin et al. | 148/1.5 |
| 3,402,081 | 9/1968 | Lehman | 148/188 |
| 3,442,721 | 5/1969 | McCaldin et al. | 148/1.5 X |
| 3,514,348 | 5/1970 | Ku | 148/188 |
| 3,541,676 | 11/1970 | Brown | 148/188 X |
| 3,767,483 | 9/1974 | Toykuyama et al. | 148/1.5 X |
| 3,787,251 | 1/1974 | Brand et al. | 148/188 X |
| 3,834,939 | 9/1974 | Beyer et al. | 148/188 X |

*Primary Examiner*—L. Dewayne Rutledge
*Assistant Examiner*—W. G. Saba
*Attorney, Agent, or Firm*—J. C. Redmond, Jr.; Maurice H. Klitzman

[57] ABSTRACT

Surface leakage paths on bipolar and FET transistors may be significantly reduced by the presence of a fixed charge in an insulating layer adhered to a semiconductor wafer. The fixed charge consists of ions which are introduced into the insulating layer after all high-temperature process treatments have been performed on the wafer. The ions are introduced into the insulating layer by (1) immersing the wafer in a solution of a suitable metal salt; (2) sandwiching the wafers between carefully cleaned non-immersed wafers and (3) driving the ions to the insulating layer-wafer interface by heating the wafer stacks in a furnace at a preselected temperature. The effective charge level embedded in the insulating layer is sufficient to protect against inversion of the wafer surface due to conductors on the insulating layer having negative potentials exceeding 10 volts and overlying the stored-charge area.

9 Claims, 5 Drawing Figures

SEMICONDUCTOR DEVICE HAVING REDUCED SURFACE LEAKAGE AND METHODS OF MANUFACTURE

BACKGROUND OF THE INVENTION

A. Field of the Invention

This invention relates to semiconductor devices and processes of manufacture. More particularly, the invention relates to semiconductor devices with reduced surface leakage paths and methods of manufacture.

B. Description of the Prior Art

The formation of surface leakage paths on a semiconductor wafer by inversion is a common problem that may occur in bipolar and field effect transistors. For example, an N-type silicon wafer with an oxide layer grown on the surface may invert to P-type conductivity through several physical mechanisms. One mechanism is the accumulation of a fixed negative charge in the oxide of sufficient quantity to invert the underlying silicon substrate from N to P-type. The presence of such an inversion layer between adjacent P regions in an N substrate gives rise to undesirable leakage currents between the regions. Another mechanism of inversion arises if conductors deposited on the oxide assume negative potentials in excess of the threshold voltage of the underlying N-type silicon substrate.

There are several known methods of preventing inversion in N-type silicon substrates. One method increases the oxide thickness. The thickened oxide increases the probability of metal conductors breaking at the point where they pass over a junction in the oxide. Etching problems are also created by the thicker oxide which requires generous layout dimensions. A second mechanism increases the donor concentration in the potential inversion regions. The increased donor concentration, however, lowers the junction breakdown voltage for adjacent P-type regions. A third method inserts N+ channel stoppers within the inversion regions. Channel stoppers are widely used but require additional layout area. They also impede design automation because the locations of inversion regions are not known until the layout is complete. A fourth method of preventing inversion is to implant positive charges into the oxide film. In Applied Physics Letters 19, Dec. 1971, pgs. 478–479, G. Sixt and A. Goetzberger have demonstrated that cesium ions implanted into the silicon surface prior to oxidation provides a stable positive oxide charge. However, the data described by Sixt and Goetzberger indicates that the positive ion charge becomes less effective as the oxide grows thicker, probably because the cesium ions prefer to concentrate near the oxide surface and/or are lost by evaporation during oxide growth.

Semiconductor structures and processes that minimize surface leakage paths between adjacent devices without (1) increasing reliability risks, (2) degrading device parameters, (3) requiring the use of specilized implantation apparatus, or (4) imposing the need for additional layout area would improve the present state of technology.

SUMMARY OF INVENTION

An object of the invention is a semiconductor device whose N-type surface is entirely or selectively stabilized against inversion.

Another object is a semiconductor LSI structure having an adherent insulating layer that includes charge levels sufficiently high to prevent inversion of the underlying semiconductor.

Another object is a silicon LSI structure having an adherent oxide film including a charge level that increases the threshold voltage against inversion from overlying conductors carrying negative potentials.

Another object is a process for fabricating semiconductor device with reduced surface leakage paths.

Another object is the process for entirely or selectively stabilizing the surface of a semiconductor device against inversion without significantly altering previously established impurity profiles.

Another object is a process for stabilizing an entire wafer surface against inversion without the need for extra masking steps.

In an illustrative embodiment, an N-type silicon substrate has an adherent oxide layer of 9000A thickness. A positive charge level of the order of $10^{12}$ ions/cm$^2$ imparted to the oxide raises the threshold voltage to approximately negative $(-)$ 50 volts. The positive charge in the oxide offsets the tendency of the negative potential across the conductor to invert N-type regions between adjacent P-type regions.

One process for imparting a positive charge to an oxide layer adherent to an N-type silicon substrate including one or more P/N junctions comprises the steps of (a) dip etching the entire wafer in buffered hydrofluoric acid to remove any phosphsilicate glass remaining after N-type diffusion; (b) immersing the wafers in an aqueous solution of cesium chloride at room temperature; (c) drying the wafers by (1) draining the excess liquid and (2) directing a stream of warm nitrogen gas over the wafer to form a layer of cesium and chlorine ions on the oxide surface; (d) driving the cesium ions at the oxide surface toward the oxide-silicon interface by (1) forming wafer stacks of carefully cleaned wafers and alternate wafers having absorbed cesium chloride films and (2) subjecting the stacks to 800° C for sixty minutes, etch contact holes and (e) forming a wiring pattern on the wafers to interconnect the active device elements.

A feature of the invention is a semiconductor device having an adherent insulating layer including a charge level of appropriate magnitude to prevent inversion of the underlying semiconductor from negative potentials appearing on conductors overlying the insulating layer.

Another feature of the invention is a silicon LSI structure having an adherent oxide layer including a charge level of the order of $10^{12}$ ions/cm$^2$ for raising the threshold voltage of the oxide with respect to overlying conductors.

Another feature of the invention is a process for fabricating semiconductor LSI structures having reduced leakage paths for immersing an oxide coated wafer in a cesium chloride solution to impart cesium ions to the oxide as a positive charge, after drying and heating of the wafer to 800° C for sixty minutes.

BRIEF DESCRIPTION OF THE DRAWINGS

The invention will be more fully apprehended from the following detailed specification taken in conjunction with the appended drawings in which.

It will be understood that all the following processes are described in terms of a single element. The steps of the process, however, are performed upon an entire wafer including a plurality of elements.

DESCRIPTION OF PREFERRED EMBODIMENT

Figure 1:
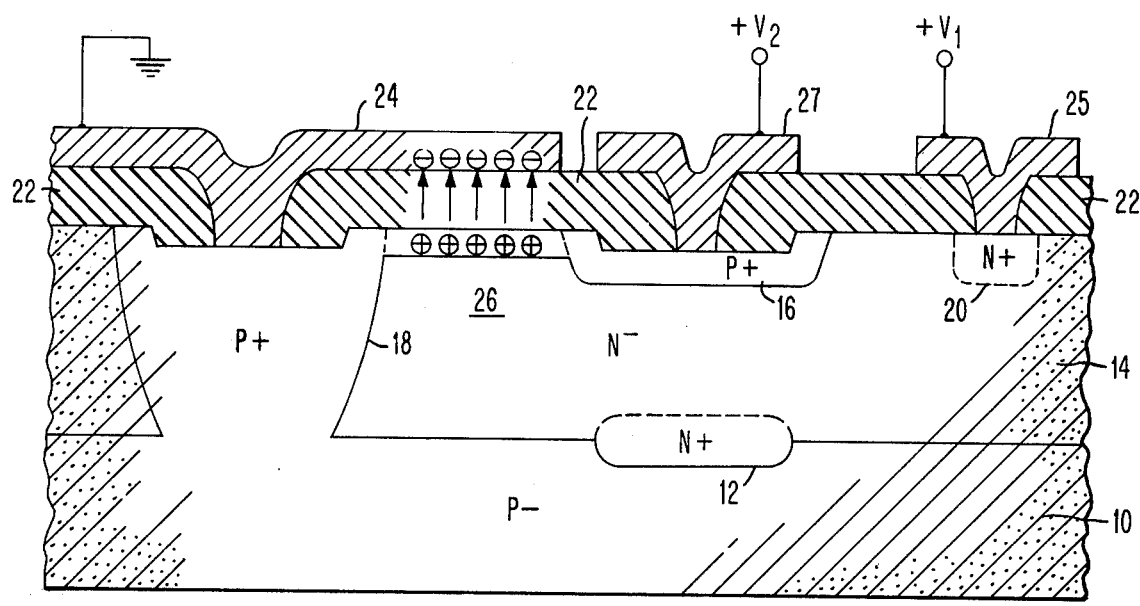
FIG. 1 is a cross sectional view of a semiconductor structure subject to the formation of surface leakage paths.

In FIG. 1, a P− substrate 10, typically silicon, includes an N+ subcollector 12 and is united to an N− expitaxial layer 14 having a resistivity of 3 to 6 ohm centimeters. The subcollector 12 has a phosphorous or arsenic dopant concentration of the order of $10^{19}$ to $10^{20}$ atoms/cm$^3$, and extends into the epitaxial layer 14. P+ base or resistor diffusions 16, and isolation diffusions 18 are formed in the layer 14. The diffusion 18 extends into the substrate 10. The regions 16 and 18 have an acceptor concentration of the order of $10^{18}$ to $10^{20}$ atoms/cm$^3$. An N+ collector contact 20 is formed in the layer 14 and has a dopant concentration similar to that of the region 12. An adherent insulating layer 22, typically silicon dioxide, is united to the surface of the layer 14. The layer 22 has a thickness of 9400° to support a conductor 24, typically aluminum, that connects to the region 18 and overlies the area adjacent to the region 16. Aluminum contacts 25 and 27 engage the regions 16 and 20, respectively. FIG. 1 shows the region 18 grounded while the regions 16 and 20 operate at voltages +V2 and +V1. The positive potential V1, which may be 10 to 50 volts, spreads into the epitaxial layer 14 through the region 20. Hence, a region 26 separating the regions 16 and 18 carries a substantial positive potential versus the grounded line 24 and the isolation region 18. The grounded conductor 24 is equivalent to a negatively biased aluminum gate over a lightly doped N− region 26 which constitutes a potential surface leakage path between the regions 16 and 18. If the applied voltage is higher than the threshold voltage across the silicon dioxide 22, the regions 26 inverts to P-type and current can flow between the normally isolated regions 16 and 18. The amount of fixed positive charge which is typically associated with thermally grown silicon dioxide will prevent strong inversion only up to positive potentials of 10 to 15 volts applied to the layer 14. Manifestly, conduction in the region 26 renders the semiconductor device inoperative.

Figure 2:
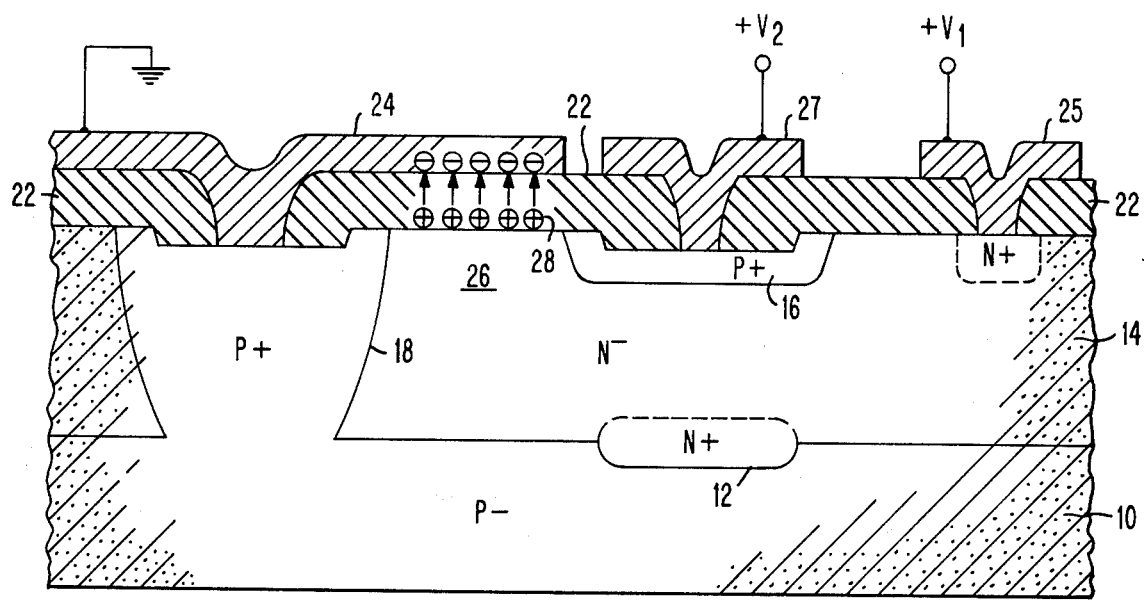
FIG. 2 is a cross sectional view of a semiconductor structure including an adherent insulating layer and charge level sufficient to prevent surface leakage paths between adjacent heavily doped P-type diffusions in the substrate.

In FIG. 2 the device of FIG. 1 has been modified to prevent inversion of the region 26. Positive charges 28 are embedded in the oxide layer 22 adjacent to the interface between the layers 14 and 22. The charge level may be formed across the entire wafer, as will be described hereinafter, or selectively in wafer areas where potential leakage paths may develop. Positive charges in the order of 1 to 2 × $10^{12}$ ions/cm$^2$ are located in the layer 22 by several techniques as will be described in conjunction with FIG. 3. This positive charge level raises the threshold voltage for inversion to 50 volts or higher and thereby prevents the formation of surface leakage paths in the region 26.

Figure 3:
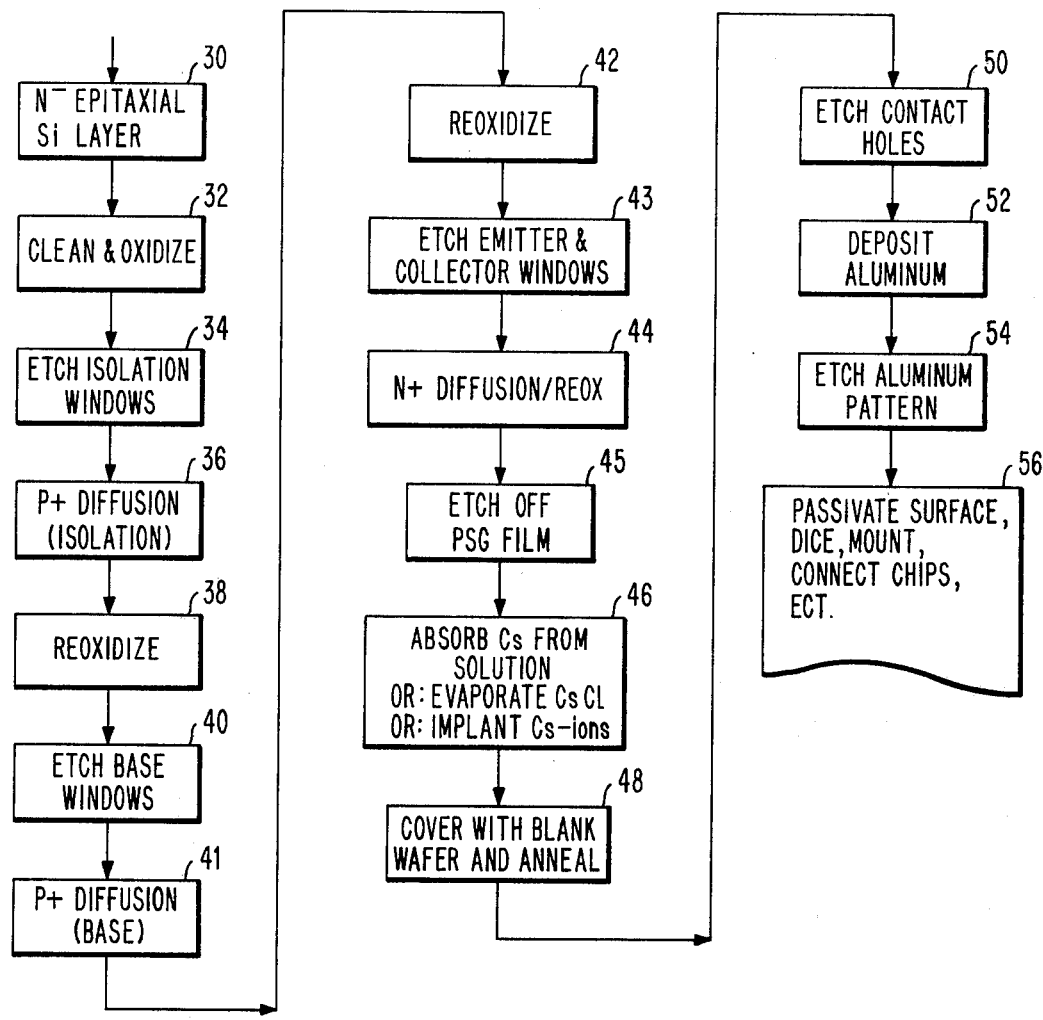
FIG. 3 is a flow diagram for fabricating the device of FIG. 2.

In FIG. 3, one example is given for fabricating a device of the type shown in FIG. 2. An operation 30 prepares a silicon substrate with an epitaxial layer by well known processes. After appropriate cleaning, an oxide layer is formed on the epitaxial layer in an operation 32. The oxide layer may be formed by thermal growth or anodizing or pyrolitic processes all well known in the art. In an operation 34 isolated windows are formed in the oxide layer by well known photolithographic etching processes. P+ isolation diffusions are formed in the epi layer within the openings in an operation 36. Standard boron diffusion processes are employed to form the isolation regions. The wafer is reoxidized in an operation 38 following similar processes employed in the operation 32. Windows are etched in the oxide layer in an operation 40. Conventional photolithographic etching processes are employed to define windows which may serve as resistor or base regions of P-type conductivity. The P+ diffusions are made using similar processes to those described in the operation 36. The wafer is reoxidized in an operation 42 using processes similar to those described in the operation 38. Openings are formed through the oxide to expose a substrate for N-type diffusion in an operation 43. The openings are formed by processes similar to those described in the operation 40. The N-type diffusions serve as emitters or collectors or resistor contacts and are made in an operation 44 using standard phosphorus diffusion techniques. Operation 44 forms a phosphosilicate glass layer across the surface of the wafer. This glass layer acts as a getter for sodium as well as for other positive ions in the oxide. Removal of the glass in an operation 45 is necessary to permit positive ions located on the oxide surface to diffuse to the oxide-silicon interface for effective inversion control. The phosphosilicate glass is removed by etching the wafer in buffered hydrofluoric acid. The glass may be removed selectively by appropriate masking steps or entirely across the wafer surface. The wafer is now ready to receive a controlled positive charge to be imparted by one of several techniques. In one technique, the wafer is immersed in an aqueous cesium chloride solution in an operation 46. The cesium chloride solution may have a concentration of 1/100th mol percent and the wafer may be immersed in the solution for ten minutes at room temperature. The wafers are removed from the solution and dried by draining excess liquid and directing a stream of warm nitrogen gas over the wafer to form a layer of cesium chloride on the oxide surface. Alternatively, another technique is to deposit cesium chloride on the wafer surface by evaporation of the salt in a vacuum system. This technique is likely to permit closer control of the amount of cesium available on the surface. Still another technique is to introduce the cesium into the oxide by ion implantation. This is the most accurate method of forming a positive charge in the oxide. However, the ion implantation apparatus must have high − mass acceleration capability. The cesium ions may be deposited entirely or selectively across the oxide using conventional photolithographic masking techniques. There are large alkali ions other than cesium, or divalent alkaline earth ions which may be employed to form a positive charge in the oxide layer, as will be described in subsequent examples.

After the preceding steps, the cesium ions are located near the silicon dioxide - air interface. An annealing operation 48 is needed to drive these ions toward the silicon-silicon dioxide interface. To prevent the gaseous escape of the cesium, the treated wafers are interleaved or sandwiched in intimate contact with carefully cleaned silicon wafers to form a wafer stack for introduction into an open tube furnace. Annealing of the wafers takes place in a range of temperature typically from 400° to 800° C and for fifteen to sixty minutes. The following charge levels were obtained in 9000° of silicon dioxide at the indicated furnace temperatures and annealing times preceded by absorption from cesium chloride solutions with concentration as shown below:

| FURNACE TREATMENT | ABSORPTION FROM SOLUTION | |
|---|---|---|
| | $10^{-2}$M CsCl | $10^{-3}$M CsCl |
| 400° C – 60 minutes | $3 \times 10^{10}/cm^2$ | 0 |
| 600° C – 15 minutes | $1 \times 10^{11}/cm^2$ | $8 \times 10^{10}/cm^2$ |
| 600° C – 60 minutes | $2.2 \times 10^{11}/cm^2$ | $5 \times 10^{10}/cm^2$ |
| 800° C – 15 minutes | $2.2 \times 10^{12}/cm^2$ | $7.9 \times 10^{11}/cm^2$ |
| 800° C – 60 minutes | $1.7 \times 10^{12}/cm^2$ | $3.6 \times 10^{11}/cm^2$ |

The data shows that the desired charge level of about $1 \times 10^{12}$ ions/cm$^2$ is obtainable over a broad range of furnace temperatures and cesium chloride concentrations.

After annealing, contact openings are formed in the oxide by conventional photolithographic masking and etching processes in an operation 50. Aluminum or other conductor metal is deposited over the wafer in an operation 52 using conventional processes. The aluminum or other metal is etched in an operation 54 to define the wiring pattern 24, 25, 27 previously described in conjunction with FIGS. 1 and 2. The wafer is passivated, diced, mounted and packaged to complete fabrication in an operation 56.

Figure 4A:
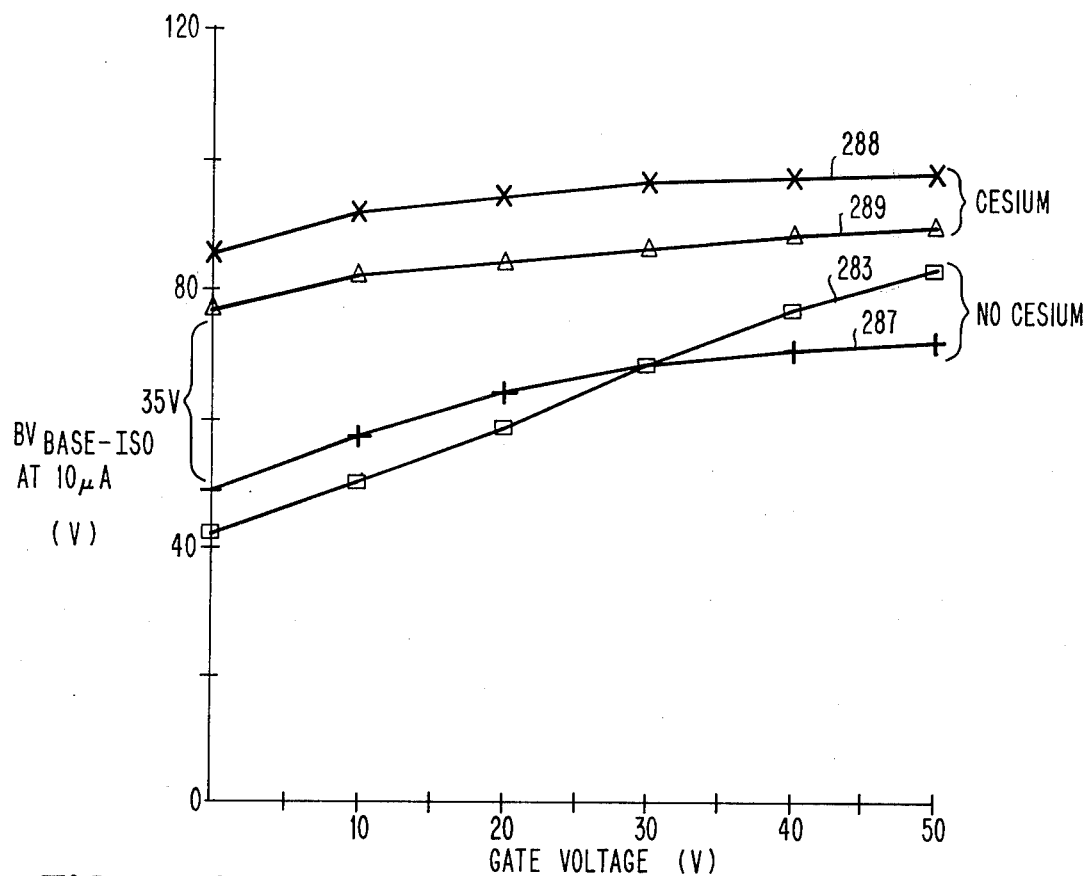
FIG. 4A is a graph of breakdown voltages versus gate voltages for inversion regions in the devices of FIGS. 1 and 2.
Figure 4B:
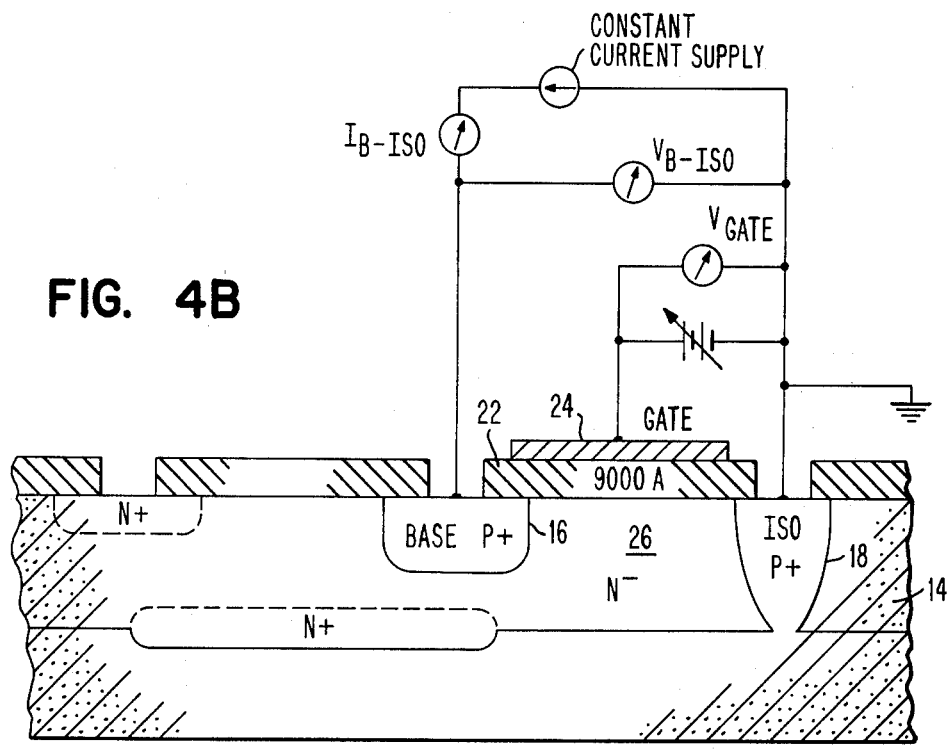
FIG. 4B is a schematic of the test circuit used for obtaining the data of FIG. 4A.

FIG. 4A shows the effect of cesium incorporated in a set of wafers 288, 289, by the process described in FIG. 3. FIG. 4A also shows data for a second set of wafers 283, 287, which do not have cesium ions embedded in the oxide layer. The abscissa of FIG. 4A is the equivalent gate voltage of a parasitic FET that establishes a leakage path between the regions 16 and 18 in FIG. 1. The parasitic FET is turned on by the conductor 24 overlying the inversion region 26. FIG. 4A shows that the cesium doped wafer set has higher breakdown voltages than the wafer set without the cesium. The 35 volt difference in breakdown voltages at zero gate voltage indicates an effective cesium ion charge of the order of $8 \times 10^{11}$ ions/cm$^2$. FIG. 4B shows the test arrangement for the data shown in FIG. 4A. A detailed explanation of FIG. 4B is not believed warranted.

EXAMPLE 2

A wafer was immersed in a 1/100th mol percent of magnesium chloride for ten minutes. The wafer was removed from the solution and blown dry with nitrogen gas. The dried wafer was sandwiched between clean silicon wafers and annealed at 900° C for thirty minutes. Flatband voltage measurements performed on the wafer indicated a charge level of the order of $3 \times 10^{11}$ positive ions/cm$^2$.

EXAMPLE 3

A wafer was immersed in a solution of 1/100th mol per liter of calcium chloride for ten minutes. The wafer was removed, dried with nitrogen gas, and sandwiched between clean silicon wafers before annealing at 900° C for thirty minutes. A charge level of $3 \times 10^{11}$ positive ions/cm$^2$ was measured in the oxide layer.

EXAMPLE 4

A wafer was immersed in a solution of $5 \times 10^4$ mol/liter of barium nitride for ten minutes. The wafer was blown dry with nitrogen gas and sandwiched between clean silicon wafers. Annealing was performed at 900° C for thirty minutes. A charge level of $9 \times 10^{11}$ positive ions/cm$^2$ was measured in the oxide layer.

EXAMPLE 5

A wafer was immersed in a solution of $2 \times 10^{-3}$ mol/liter rubidium chloride for ten minutes. The wafer was removed and blown dry with nitrogen gas. The wafer was annealed at 900° C for five minutes. A charge level of $7 \times 10^{11}$ positive ions/cm$^2$ was measured in the oxide layer.

While the invention has been described in connection with bipolar device structures, the same techniques are applicable to FET devices. In the case of FET devices, however, the FET channel between source and drain must be masked against the positive ions to prevent undesirable changes of the threshold voltage.

While the invention has been particularly shown and described with reference to the preferred embodiments thereof, it will be understood by those skilled in the art that the foregoing and other changes in form and details may be made therein without departing from the spirit and scope of the invention.

What is claimed is:
1. A process for fabricating a semiconductor comprising steps of
   a. forming an insulating layer on a semiconductor substrate,
   b. forming a layer of positive ions on the surface of the insulating layer,
   c. covering the insulating layer with a blank wafer to prevent gaseous escape of the positive ions from the insulating layer, and
   d. driving the positive ions toward the substrate/insulating layer interface to achieve a positive charge level exceeding $2 \times 10^{11}$ ions/cm$^2$ to prevent the formation of surface leakage paths on the substrate by potentials across the insulating layer exceeding 10 volts.

2. The process of claim 1 wherein the layer of positive ions is formed on the surface by immersing the substrate in an aqueous solution of large alkali ions.

3. The process of claim 1 wherein the layer of positive ions is formed on the surface by evaporation of a alkali halide salt in a vacuum system.

4. The process of claim 1 wherein the layer of positive ions is formed on the surface by ion implantation of large alkali ions.

5. The process of claim 1 wherein the layer of positive ions on the surface of the insulating layer is taken from the group consisting of cesium chloride, magnesium chloride, barium nitride, and rubidium chloride.

6. The process of claim 5 wherein the positive ions are driven through the insulating layer by heating the substrate at a temperature in the range of 400°–900° C for a time period in the range of 5–60° minutes.

7. The process of claim 6 wherein the insulating layer is etched to remove surface films which serve as ion diffusion barriers prior to forming a layer of positive ions on the surface of the insulating layer.

8. The process of claim 7 wherein the semiconductor substrate is of silicon and the insulating layer is an oxide having a thickness exceeding 2000A.

9. The process of claim 1 wherein the semiconductor substrates having a layer of positive ions on the surface of the insulating layer are sandwiched between semiconductor wafers prior to driving the positive ions through the insulating layer.

* * * * *